US009650732B2

(12) United States Patent
Kocab et al.

(10) Patent No.: US 9,650,732 B2
(45) Date of Patent: May 16, 2017

(54) LOW DEFECT NANOTUBE APPLICATION SOLUTIONS AND FABRICS AND METHODS FOR MAKING SAME

(71) Applicant: Nantero Inc., Woburn, MA (US)

(72) Inventors: J. Thomas Kocab, Exeter, RI (US); Thomas R. Bengtson, Derry, NH (US); Sanjin Hosic, Somervile, MA (US); Rahul Sen, Lexington, MA (US); Billy Smith, Woburn, MA (US); David A. Roberts, Woburn, MA (US); Peter Sites, Marblehead, MA (US)

(73) Assignee: Nantero Inc., Woburn, MA (US)

( * ) Notice: Subject to any disclaimer, the term of this patent is extended or adjusted under 35 U.S.C. 154(b) by 0 days.

(21) Appl. No.: 14/265,602

(22) Filed: Apr. 30, 2014

(65) Prior Publication Data

US 2014/0329430 A1    Nov. 6, 2014

Related U.S. Application Data

(60) Provisional application No. 61/818,417, filed on May 1, 2013.

(51) Int. Cl.
*B05D 3/12* (2006.01)
*D04H 1/732* (2012.01)
(Continued)

(52) U.S. Cl.
CPC ........... *D04H 1/732* (2013.01); *D04H 1/4242* (2013.01); *B05D 3/002* (2013.01); *B05D 3/12* (2013.01); *B05D 7/24* (2013.01); *Y10T 442/60* (2015.04)

(58) Field of Classification Search
CPC . B05D 3/002; B05D 3/12; B05D 7/24; D04H 1/4242; D06B 23/205
See application file for complete search history.

(56) References Cited

U.S. PATENT DOCUMENTS 6,057,637 A    5/2000    Zettl
6,187,823 B1    2/2001    Haddon et al.
(Continued)

FOREIGN PATENT DOCUMENTS

EP    0947466    6/1999
EP    1061040    12/2000
(Continued)

OTHER PUBLICATIONS

Ago, et al., "Workfunction of Purified and Oxidized Carbon Nanotubes," Synthetic Metals, vol. 103, 1999, pp. 2494-2495.
(Continued)

*Primary Examiner* — Kirsten Jolley
(74) *Attorney, Agent, or Firm* — Nantero Inc.

(57) ABSTRACT

The present disclosure provides methods for removing defects nanotube application solutions and providing low defect, highly uniform nanotube fabrics. In one aspect, a degassing process is performed on a suspension of nanotubes to remove air bubbles present in the solution. In another aspect, a continuous flow centrifugation (CFC) process is used to remove small scale defects from the solution. In another aspect, a depth filter is used to remove large scale defects from the solution. According to the present disclosure, these three methods can be used alone or combined to realize a low defect nanotube application solutions and fabrics.

23 Claims, 4 Drawing Sheets

(51) Int. Cl.
*D04H 1/4242* (2012.01)
*B05D 7/24* (2006.01)
*B05D 3/00* (2006.01)

(56) References Cited

U.S. PATENT DOCUMENTS

| | | | |
|---|---|---|---|
| 6,277,318 B1 | 8/2001 | Bower | |
| 6,331,262 B1 | 12/2001 | Haddon et al. | |
| 6,342,276 B1 | 1/2002 | You | |
| 6,368,569 B1 | 4/2002 | Haddon et al. | |
| 6,409,567 B1 | 6/2002 | Amey, Jr. et al. | |
| 6,423,583 B1 | 7/2002 | Avouris et al. | |
| 6,495,116 B1 | 12/2002 | Herman | |
| 6,495,258 B1 | 12/2002 | Chen et al. | |
| 6,515,339 B2 | 2/2003 | Shin et al. | |
| 6,528,020 B1 | 3/2003 | Dai et al. | |
| 6,531,513 B2 | 3/2003 | Haddon et al. | |
| 6,630,772 B1 | 10/2003 | Bower et al. | |
| 6,641,793 B2 | 11/2003 | Haddon et al. | |
| 6,645,628 B2 | 11/2003 | Shiffler, Jr. et al. | |
| 6,706,402 B2 | 3/2004 | Rueckes et al. | |
| 6,707,098 B2 | 3/2004 | Hofmann et al. | |
| 6,752,977 B2 | 6/2004 | Smalley et al. | |
| 6,808,746 B1 | 10/2004 | Dai et al. | |
| 6,833,558 B2 | 12/2004 | Lee et al. | |
| 6,835,591 B2 | 12/2004 | Rueckes et al. | |
| 6,858,197 B1 | 2/2005 | Delzeit | |
| 6,863,942 B2 | 3/2005 | Ren et al. | |
| 6,888,773 B2 | 5/2005 | Morimoto | |
| 6,890,780 B2 | 5/2005 | Lee | |
| 6,896,864 B2 | 5/2005 | Clarke | |
| 6,899,945 B2 | 5/2005 | Smalley et al. | |
| 6,905,892 B2 | 6/2005 | Esmark | |
| 6,918,284 B2 | 7/2005 | Snow et al. | |
| 6,919,592 B2 | 7/2005 | Segal et al. | |
| 6,919,740 B2 | 7/2005 | Snider | |
| 6,921,575 B2 | 7/2005 | Horiuchi et al. | |
| 6,924,538 B2 | 8/2005 | Jaiprakash et al. | |
| 6,946,410 B2 | 9/2005 | French et al. | |
| 7,057,402 B2 | 6/2006 | Cole et al. | |
| 7,115,864 B2 | 10/2006 | Colbert et al. | |
| 7,259,410 B2 | 8/2007 | Jaiprakash et al. | |
| 7,335,395 B2 | 2/2008 | Ward et al. | |
| 7,365,632 B2 | 4/2008 | Bertin et al. | |
| 7,375,369 B2 | 5/2008 | Sen et al. | |
| 7,566,478 B2 | 7/2009 | Ward et al. | |
| 7,666,382 B2 | 2/2010 | Ghenciu et al. | |
| 7,781,862 B2 | 8/2010 | Bertin et al. | |
| 7,858,185 B2 | 12/2010 | Sen et al. | |
| 7,927,992 B2 | 4/2011 | Ward et al. | |
| 8,217,490 B2 | 7/2012 | Bertin et al. | |
| 2001/0004979 A1 | 6/2001 | Han et al. | |
| 2002/0081380 A1 | 6/2002 | Dillon et al. | |
| 2002/0160111 A1 | 10/2002 | Sun et al. | |
| 2003/0004058 A1 | 1/2003 | Li et al. | |
| 2003/0065206 A1 | 4/2003 | Bolskar et al. | |
| 2003/0122111 A1 | 7/2003 | Glatkowski | |
| 2003/0177450 A1 | 9/2003 | Nugent | |
| 2003/0200521 A1 | 10/2003 | DeHon et al. | |
| 2003/0220518 A1 | 11/2003 | Bolskar et al. | |
| 2004/0005723 A1 | 1/2004 | Empedocles et al. | |
| 2004/0007528 A1 | 1/2004 | Bakajin et al. | |
| 2004/0023253 A1 | 2/2004 | Kunwar et al. | |
| 2004/0031975 A1 | 2/2004 | Kern et al. | |
| 2004/0034177 A1 | 2/2004 | Chen | |
| 2004/0041154 A1 | 3/2004 | Watanabe et al. | |
| 2004/0043527 A1 | 3/2004 | Bradley et al. | |
| 2004/0071949 A1 | 4/2004 | Glatkowski et al. | |
| 2004/0099438 A1 | 5/2004 | Arthur et al. | |
| 2004/0104129 A1 | 6/2004 | Gu et al. | |
| 2004/0132070 A1 | 7/2004 | Star et al. | |
| 2004/0181630 A1 | 9/2004 | Jaiprakash et al. | |
| 2004/0253167 A1 | 12/2004 | Silva et al. | |
| 2004/0265550 A1 | 12/2004 | Glatkowski et al. | |
| 2004/0266106 A1 | 12/2004 | Lee | |
| 2005/0053525 A1 | 3/2005 | Segal et al. | |
| 2005/0058797 A1 | 3/2005 | Sen et al. | |
| 2005/0065741 A1 | 3/2005 | Segal et al. | |
| 2005/0095938 A1 | 5/2005 | Rosenberger et al. | |
| 2005/0212014 A1 | 9/2005 | Horibe et al. | |
| 2005/0269554 A1 | 12/2005 | Sen et al. | |
| 2006/0052509 A1 | 3/2006 | Saitoh | |
| 2006/0204427 A1 | 9/2006 | Ghenciu et al. | |
| 2006/0237537 A1 | 10/2006 | Empedocles | |
| 2007/0004191 A1 | 1/2007 | Gu et al. | |
| 2008/0203380 A1* | 8/2008 | Wang et al. | 257/9 |
| 2013/0052449 A1 | 2/2013 | Sen et al. | |

FOREIGN PATENT DOCUMENTS

| | | |
|---|---|---|
| GB | 2364933 | 2/2002 |
| JP | 11008690 | 1/1999 |
| JP | 11210336 | 7/1999 |
| JP | 2002258885 | 4/2002 |
| WO | WO-98/39250 | 9/1998 |
| WO | WO-99/65821 | 12/1999 |
| WO | WO-00/17101 | 3/2000 |
| WO | WO-01/03208 | 1/2001 |
| WO | WO-02/45113 | 6/2002 |
| WO | WO-02/48701 | 6/2002 |
| WO | WO-02/060812 | 8/2002 |
| WO | WO-03/016901 | 2/2003 |
| WO | WO-03/022733 | 3/2003 |
| WO | WO-03/034142 | 4/2003 |
| WO | WO-03/091486 | 11/2003 |
| WO | WO-2004/039893 | 5/2004 |
| WO | WO-2004/065655 | 8/2004 |
| WO | WO-2004/065657 | 8/2004 |
| WO | WO-2004/065671 | 8/2004 |
| WO | WO-2006/078293 | 7/2006 |

OTHER PUBLICATIONS

Ajayan, et al., "Applications of Carbon Nanotubes," Topics Appl. Phys., vol. 80, 2001, pp. 391-425.

Amblard, G., "Development and characterization of carbon nanotube processes for NRAM technology," Proc. of SPIE 2011, vol. 7970, pp. 797017-1-797017-7.

Ausman, et al., "Organic Solvent Dispersions of Single-Walled Carbon Nanotubes: Toward Solutions of Pristine Nanotubes," J. Phys. Chem. B, 2000, vol. 104, No. 38, pp. 8911-8915.

Awano, Y., "Graphene for VLSI: FET and Interconnect Applications," IEDM 2009 Technical Digest, pp. 10.1.1-10.1.4.

Bahr, et al., "Dissolution of Small Diameter Single-Wall Carbon Nanotubes in Organic Solvents," Chem. Commun., 2001, pp. 193-194.

Banerjee, et al., "Functionalization of Carbon Nanotubes with a Metal-Containing Molecular Complex," Nano Letters, vol. 2, No. 1, 2002, pp. 49-53.

Berhan, et al., "Mechanical Properties of Nanotube Sheets: Alterations in Joint Morphology and Achievable Moduli in Manufacturable Materials," J. Appl. Phys., vol. 95, No. 8, Apr. 2004, pp. 4335-4345.

Bonard, et al., "Monodisperse Multiwall Carbon Nanotubes Obtained with Ferritin as Catalyst," Nano Letters, vol. 2, No. 6, 2002, pp. 665-667.

Brock, et al., "Carbon Nanotube Memories and Fabrics in a Radiation Hard Semiconductor Foundry," 2005 IEEE Conference, 9 pgs.

Brown, K. M., "System in package "The Rebirth of SIP"," 2004 IEEE Custom Integrated Circuits, May 2004, 6 pgs.

Cassell, et al., "Large Scale CVD Synthesis of Single-Walled Carbon Nanotubes," J. Phys. Chem. B, vol. 103, 1999, pp. 6484-6492.

Chen, et al., "Dissolution of Full-Length Single-Walled Carbon Nanotubes," J. Phys. Chem. B, 2001, vol. 105, pp. 2525-2528.

Chen, et al., "Heterogeneous Single-Walled Carbon Nanotube Catalyst Discovery and Optimization," Chem. Mater., vol. 14, 2002, pp. 1891-1896.

Chen, et al., "Noncovalent Sidewall Functionalization of Single-Walled Carbon Nanotubes for Protein Immobilization," J. Am. Chem. Soc., 2001, vol. 123, pp. 3838-3839.

(56) References Cited

OTHER PUBLICATIONS

Chen, et al., "Solution Properties of Single-Walled Carbon Nanotubes," Science, 1998, pp. 95-98.
Cheng, H.M., "Large-Scale and Low-Cost Synthesis of Single-Walled Carbon Nanotubes by the Catalytic Pyrolysis of Hydrocarbons," Appl. Phys. Ltrs., vol. 72, No. 25, Jun. 1998, pp. 3282-3284.
Chiang, et al., "Purification and Characterization of Single-Wall Carbon Nanotubes (SWNTs) Obtained from the Gas-Phase Decomposition of CO (HiPco Process)," J. Phys. Chem. B, vol. 105, 2001, pp. 8297-8301.
Chiang, et al., "Purification and Characterization of Single-Wall Carbon Nanotubes," J. Phys. Chem. B, 2001, vol. 105, pp. 1157-1161.
Colomer, et al., "Different Purification Methods of Carbon Nanotubes Produced by Catalytic Synthesis," Synthesis Metals, 1999, vol. 103, pp. 2482-2483.
Crowley, et al., "512 Mb PROM with 8 layers of antifuse/Diode cells," IEEE International Solid-State Circuits Conference, vol. XLVI, Feb. 2003, pp. 284-285.
Cui, et al., "Carbon Nanotube Memory Devices of High Charge," Applied Phys. Ltrs., vol. 81, No. 17, Oct. 2002, pp. 3260-3262.
Dai, et al., "Controlled Chemical Routes to Nanotube Architectures, Physics, and Devices," J. Phys. Chem. B, vol. 103, 1999, pp. 11246-11255.
Delzeit, et al., "Multilayered Metal Catalysts for Controlling the Density of Single-Walled Carbon Nanotube Growth," Chem. Phys. Ltrs., vol. 348, 2001, pp. 368-374.
Desai, et al., "Freestanding Carbon Nanotube Specimen Fabrication," Proceeding 2005 5$^{th}$ IEEE Conference on Nanotechnology, Nagoya, Japan, Jul. 2005, 4 pgs.
Dillon, et al., "A Simple and Complete Purification of Single-Walled Carbon Nanotube Materials," Adv. Mater., 1999, vol. 11, No. 16, pp. 1354-1358.
Franklin, et al., "An Enhanced CVD Approach to Extensive Nanotube Networks with Directionality," Adv. Mater., vol. 12, No. 12, 2000, pp. 890-894.
Fuhrer, et al., "High-Mobility Nanotube Transistor Memory," Nano Letters, vol. 2, No. 7, 2002, pp. 755-759.
Georgakilas, et al., "Organic Functionalization of Carbon Nanotubes," J. Am. Chem. Soc., 2002, vol. 124, No. 5, pp. 760-761.
Gromov, "Purification of Carbon Nanotubes," Caramel Workshop, Jan. 23, 2002, 13 pgs.
Haddon, et al., "Purification and Separation of Carbon Nanotubes," MRS Bulletin, Apr. 2004, pp. 252-259 (www.mrs.org/publicatons/bulletins).
Hafner, et al., "Catalytic Growth of Single-Wall Carbon Nanotubes from Metal Particles," Chem. Phys. Ltrs., vol. 296, 1998, pp. 195-202.
Hirsch, A., "Functionalization of Single-Walled Carbon Nanotubes," Angew Chem. Int. Ed., 2002, vol. 41, No. 11, pp. 1853-1859.
Homma, et al., "Single-Walled Carbon Nanotube Growth on Silicon Substrates Using Nanoparticle Catalysts," Jpn, J. Appl. Phys., vol. 41, 2002, pp. L89-L91.
Hou, et al., "Multi-Step Purification of Carbon Nanotubes," Carbon, 2002, vol. 40, pp. 81-85.
Huai, Y., "Spin-Transfet Torque MRAM (STT-MTAM): Challenges and Prospects," AAPS Bulletin, vol. 18, No. 6, Dec. 2008, pp. 33-40.
International Search Report, International Patent Application No. PCT/US05/18465 dated Aug. 21, 2006, 3 pgs.
International Search Report, International Patent Application No. PCT/US05/18467 dated Oct. 1, 2007, 5 pgs.
International Search Report, International Patent Application No. PCT/US05/18539 dated Sep. 18, 2006, 4 pgs.
International Search Report, International Patent Application No. PCT/US05/45316 dated Sep. 6, 2005, 2 pgs.
Islam, et al., "High Weight Fraction Surfactant Solubilization of Single-Wall Carbon Nanotubes in Water," Nano Letters, 2003, vol. 3, No. 2, pp. 269-273.
Jeong, et al., "A Purification Method of Single-Wall Carbon Nanotubes Using H2S and 02 Mixture Gas," Chem. Phys. Ltrs., vol. 344, Aug. 2001, pp. 18-22.
Jiang, et al., "Performance Breakthrough in 8nm Gate-All-Around Length Gate-All Around Nanowire Transistors using Metallic Nanowire Contacts," 2008 Symposium on VLSI Technology Digest of Technical Papers, pp. 34-35.
Johnson, R., Colin, "IBM Grows Nanotube Patterns on Silicon Wafers," EE Times, Sep. 2002, 1 pg.
Joselevich, et al., "Vectorial Growth of Metallic and Semiconducting Single-Wall Carbon Nanotubes," Nano Letters, vol. 0, No. 0, A-E, 2002.
Kahn, et al., "Solubilization of Oxidized Single-Walled Carbon Nanotube in Organic and Aqueous Solvents through Organic Derivatization," Nano Letters, vol. 2, No. 11, 2002, pp. 1215-1218.
Kianian, et al., "A 3D Stackable Carbon Nanotube-based Nonvolatile Memory (NRAM)," ESSDERC, Nantero, Inc., Jun. 14, 2010, 4 pgs.
Kong, et al., "Chemical Vapor Deposition of Methane for Single-Walled Carbon Nanotubes," Chem. Phys. Ltrs., vol. 292, Aug. 1998, pp. 567-574.
Kong, et al., "Nanotube Molecular Wires as Chemical Sensors," Science, vol. 287, Jan. 2000, pp. 622-625.
Li, et al., "Carbon Nanotube Nanoelectrode Array for Ultrasensitive DNA Detection," Nano Letters, vol. 3, No. 5, 2003, pp. 597-602.
Li, et al., "Growth of Single-Walled Carbon Nanotubes from Discrete Catalytic Nanoparticles of Various Sizes," J. Phys. Chem. B, vol. 105, 2001, pp. 11424-11431.
Li, et al., "Preparation of Monodispersed Fe—Mo Nanoparticles as the Catalyst for CVD Synthesis of Carbon Nanotubes," Chem. Mater., vol. 13, 2001, pp. 1008-1014.
Martinez, et al., "Modifications of Single-Wall Carbon Nanotubes upon Oxidative Purification Treatments," http://www.iop org/EJ/abstract/0957-4484/1417/301_printed May 20, 2004.
Matarredona, "Dispersion of Single-Walled Carbon Nanotubes in Aqueous Solutions of the Anionic Surfactant," J. Phys. Chem., 2003, vol. 107, pp. 13357-13367.
Mickelson, et al., "Solvation as Fluorinated Single-Wall Carbon Nanotubes in Alcohol Solvents," J. Phys. Chem. B, 1999, vol. 103, pp. 4318-4322.
Moore, et al., "Individually Suspended Single-Walled Carbon Nanotubes in Various Surfactants," Nano Letters, 2003, pp. 1379-1382.
"Multifunctional Nanotube Composites," http://www.ornl.gov/-odg/compositesmain.html printed May 20, 2004, 5 pgs.
Murphy, et al., "High-Yield, Nondestructive Purification and Quantification Method for Multiwalled Carbon Nanotubes," J. Phys. Chem. B, 2002, vol. 106, pp. 3087-3091.
Nerushev, et al., "Carbon Nanotube Films Obtained by Thermal Chemical Vapour Deposition," J. Mater. Chem., vol. 11, 2001, pp. 1122-1132.
Niu, et al., "High Power Electrochemical Capacitors Based on Carbon Nanotube Electrodes," Appl. Phys. Ltrs., vol. 70, No. 11, Mar. 1997, pp. 1480-1482.
Niyogi, et al., "Ultrasonic Dispersions of Single-Walled Carbon Nanotubes," J. Phys. Chem. B, 2003, vol. 107, pp. 8799-8804.
Novak, et al., "Nerve Agent Using Networks of Single-Walled Carbon Nanotubes," Appl. Phys. Ltr, vol. 83, No. 19, Nov. 2003, pp. 4026-4028.
O'Connell, et al., "Reversible Water-Solubilization of Single-Walled Carbon Nanotubes by Polymer Wrapping," Chem. Phys. Lett., 2001, vol. 342, pp. 265-271.
Onoa, et al., "Bulk Production of Singly Dispersed Carbon Nanotubes with Prescribed Lengths," Nanotechnology, vol. 16, 2005, pp. 2799-2803.
Parikh, et al., "Flexible Vapour Sensors Using Single Walled Carbon Nanotubes," Sensors and Actuators B, vol. 113, 2006, pp. 55-63.
Peigney, et al., "A Study of the Formation of Single- and Double-Walled Carbon Nanotubes by a CVD Method," J. Phys. Chem. B, vol. 105, 2001, pp. 9699-9710.
Pompeo, et al., "Water Solubilization of Single-Walled Carbon Nanotubes by Functionalization with Glucosamine," Nano Letters, 2002, vol. 2, No. 4, pp. 369-373.

(56) References Cited

OTHER PUBLICATIONS

Qi, et al., "Toward Large Arrays of Multiplex Functionalized Carbon Nanotube Sensors for Highly Sensitive and Selective Molecular Detection," Nano Letters, vol. 3, No. 3, 2003, pp. 347-351.

Riggs, et al., "Optical Limiting Properties of Suspended and Solubilized Carbon Nanotubes," J. Phys. Chem. B, 2000, vol. 104, pp. 7071-7076.

Riggs, et al., "Strong Luminescence of Solubilized Carbon Nanotubes," J. Am. Chem. Soc., 2000, vol. 122, pp. 5879-5880.

Rinzler, et al., Large-Scale Purification of Single-Wall Carbon Nanotubes: Process, Product, and Characterization, Appl. Phys. A, 1998, vol. 67, pp. 29-37.

Rosendale, et al., "A 4 Megabit Carbon Nanotube-based Nonvolatile Memory (NRAM)," ESSCIRC 2010 Proceedings, pp. 478-481.

Rueckes, et al., "Carbon Nanotube-Based Nonvolatile Random Access Memory for Molecular Computing," Science, 2000, vol. 289, pp. 94-97.

Servalli, G., "A 45nm Generation Phase Change Memory Technology," IEDM 2009 Technical Digest, pp. 5.7.1-5.7.4.

Shelimov, et al., "Purification of Single-Wall Carbon Nanotubes by Electronically Assisted Filtration," Chem. Phys. Ltrs., vol. 282, 1998, pp. 429-434.

Smith, et al., "Contamination Control and Pilot Manufacturing of Commercial Grade Carbon Nanotube Colloidal Formulations," 2013 SEMI Advanced Semiconductor Manufacturing Conference (ASMC 2013), 5 pages.

Snow, et al., "Random Networks of Carbon Nanotubes as an Electronic Material," App. Phys. Ltrs., vol. 82, No. 13, Mar. 2003, pp. 2145-2147.

Sotiropoulou, et al., "Carbon Nanotube Array-Based Biosensor," Anal Bioanal Chem, vol. 375, 2003, pp. 103-105.

Star, et al., "Nanoelectronic Carbon Dioxide Sensors," Adv. Mater., vol. 16, No. 22, 2004, pp. 2049-2052.

Star, et al., "Nanotube Optoelectronic Memory Devices," Nano Letters, vol. 4, No. 9, 2004, pp. 1587-1591.

Star, et al., "Preparation and Properties of Polymer-Wrapped Single-Walled Carbon Nanotubes," Angew. Chem. Int. Ed., 2001, vol. 40, No. 9, pp. 1721-1725.

Sun, et al., "High Dissolution and Strong Light Emission of Carbon Nanotubes in Aromatic Amine Solvents," J. Am. Chem. Soc., 2001, vol. 123, pp. 5348-5349.

Sun, et al., "Soluble Dendron-Functionalized Carbon Nanotubes: Preparation, Characterization, and Properties," Chem. Mater., 2001, vol. 13, pp. 2864-2869.

TIPO's Search Report for ROC Patent Application No. 094118087, 1 pg.

Valentini, et al., "Sensors for sub-ppm NO2 Gas Detection Based on Carbon Nanotube Thin Films," Appl. Phys. Ltrs., vol. 82, No. 6, Feb. 2003, pp. 961-963.

Vivechand, et al., "A New Method of Preparing Single-Walled Carbon Nanotubes," Proc. Indian Acad. Sci. (Chem. Sci.), 2003, vol. 115, Nos. 5 & 6, pp. 209-518.

Ward, et al., "A Non-Volatile Nanoelectromechanical Memory Element Utilizing a Fabric of Carbon Nanotubes," IEEE 2004, pp. 34-38.

"Wonderous World of Carbon Nanotubes," Multi Disciplinair Project, http://www.students.chem.tue.N1/ifp03/purification.html, 2004, 11 pgs.

Zhang, et al., "Metal Coating on Suspended Carbon Nanotubes and its Implications to Metal-tube Interaction," Chem. Phys. Ltrs., vol. 331, 2000, pp. 35-41.

Zhang, et al., "Select Pathways to Carbon Nanotube Film Growth," Adv. Mater., vol. 13, No. 23, Dec. 2001, pp. 1767-1770.

Zhang, et al., "Formation of Metal Nanowires on Suspended Single-Walled Carbon Nanotubes," Appl. Phys. Ltrs., vol. 77, No. 19, Nov. 2000, pp. 3015-3017.

Zhao, et al., "Frequency-Dependent Electrical Transport in Carbon Nanotubes," Phys. Review B, vol. 64, 2001, pp. 201402-1-201402-4.

Zhou, et al., "p-Channel, n-Channel Thin Film Transistors and p-n Diodes Based on Single Wall Carbon Nanotube Networks," Nano Letters, vol. 4, No. 10, 2004, pp. 2031-2035.

\* cited by examiner

LOW DEFECT NANOTUBE APPLICATION SOLUTIONS AND FABRICS AND METHODS FOR MAKING SAME

CROSS-REFERENCE TO RELATED APPLICATIONS

This application claims the benefit of priority to U.S. Provisional Application No. 61/818,417, entitled "Low Defect Nanotube Application Solutions And Fabrics And Methods Of Making Same," filed on May 1, 2013, the entire contents of which are incorporated herein by reference.

This application relates to the following U.S. patents, which are assigned to the assignee of this application, and are hereby incorporated by reference in their entirety:

Methods of Nanotube Films and Articles (U.S. Pat. No. 6,835,591), filed Apr. 23, 2002;

Methods of Using Pre-Formed Nanotubes to Make Carbon Nanotube Films, Layers, Fabrics, Ribbons, Elements, and Articles (U.S. Pat. No. 7,335,395), filed Jan. 13, 2003;

Methods of Making Carbon Nanotube Films, Layers, Fabrics, Ribbons, Elements, and Articles (U.S. Pat. No. 7,566,478), filed Jan. 13, 2003;

Devices Having Horizontally-Disposed Nanofabric Articles and Methods of Making the Same (U.S. Pat. No. 7,259,410), filed Feb. 11, 2004;

Devices Having Vertically-Disposed Nanofabric Articles and Methods of Making Same (U.S. Pat. No. 6,924,538), filed Feb. 11, 2004;

Spin-Coatable Liquid for Formation of High Purity Nanotube Films (U.S. Pat. No. 7,375,369), filed Jun. 3, 2004;

High Purity Nanotube Fabrics and Films (U.S. Pat. No. 7,858,185), filed Jun. 3, 2004;

Resistive Elements Using Carbon Nanotubes (U.S. Pat. No. 7,365,632), filed Sep. 20, 2005;

Two-Terminal Nanotube Devices And Systems And Methods Of Making Same (U.S. Pat. No. 7,781,862), filed Nov. 15, 2005;

Aqueous Carbon Nanotube Applicator Liquids and Methods for Producing Applicator Liquids Thereof (U.S. Pat. No. 7,666,382), filed Dec. 15, 2005;

Nonvolatile Nanotube Diodes And Nonvolatile Nanotube Blocks And Systems Using Same And Methods Of Making Same (U.S. Pat. No. 8,217,490), filed Aug. 8, 2007; and Carbon Nanotubes For The Selective Transfer Of Heat From Electronics (U.S. Pat. No. 7,927,992), filed Mar. 6, 2008.

This application relates to the following patent applications, which are assigned to the assignee of this application, and are hereby incorporated by reference in their entirety:

Anisotropic Nanotube Fabric Layers and Films and Methods of Forming Same (U.S. patent application Ser. No. 12/533,704), filed Jul. 31, 2009;

Nanotube Solution Treated With Molecular Additive, Nanotube Film Having Enhanced Adhesion Property, And Methods For Forming The Nanotube Solution And The Nanotube Film (U.S. patent application Ser. No. 13/416,820), filed Mar. 9, 2012;

Methods for Controlling Density, Porosity, and/or Gap Size within Nanotube Fabric Layers and Films (U.S. patent application Ser. No. 13/578,691), filed Aug. 13, 2012; and Nanotube Solutions With High Concentration And Low Contamination And Methods For Purifying Nanotube Solutions (U.S. patent application Ser. No. 13/825,070), filed Mar. 19, 2013.

TECHNICAL FIELD

The present disclosure relates to a nanotube solution, a nanotube film or fabric formed from the nanotube solution, and methods for forming the nanotube solution and the nanotube film or fabric. More particularly, the present disclosure relates to methods for preparing nanotube solutions such as can be used to form highly uniform nanotube fabrics with low defects.

BACKGROUND OF THE INVENTION

Any discussion of the related art throughout this specification should in no way be considered as an admission that such art is widely known or forms part of the common general knowledge in the field.

Nanotube fabric layers and films are used in a plurality of electronic structures, and devices. For example, U.S. Pat. No. 8,217,490 to Bertin et al., incorporated herein by reference in its entirety, teaches methods of using nanotube fabric layers to realize nonvolatile devices such as, but not limited to, block switches, programmable resistive elements, and programmable logic devices. U.S. Pat. No. 7,365,632 to Bertin et al., incorporated herein by reference, teaches the use of such fabric layers and films within the fabrication of thin film nanotube based resistors. U.S. Pat. No. 7,927,992 to Ward et al., incorporated herein by reference in its entirety, teaches the use of such nanotube fabrics and films to form heat transfer elements within electronic devices and systems.

Through a variety of previously known techniques (described in more detail within the incorporated references) nanotube elements can be rendered conducting, non-conducting, or semi-conducting before or after the formation of a nanotube fabric layer or film, allowing such nanotube fabric layers and films to serve a plurality of functions within an electronic device or system. Further, in some cases the electrical conductivity of a nanotube fabric layer or film can be adjusted between two or more non-volatile states as taught in U.S. Pat. No. 7,781,862 to Bertin et al., incorporated herein by reference in its entirety, allowing for such nanotube fabric layers and films to be used as memory or logic elements within an electronic system.

U.S. Pat. No. 7,335,395 to Ward et al., incorporated herein by reference in its entirety, teaches a plurality of methods for forming nanotube fabric layers and films on a substrate element using preformed nanotubes. The methods include, but are not limited to, spin coating (wherein a solution of nanotubes is deposited on a substrate which is then spun to evenly distribute said solution across the surface of said substrate), spray coating (wherein a plurality of nanotubes are suspended within an aerosol solution which is then dispersed over a substrate), and dip coating (wherein a plurality of nanotubes are suspended in a solution and a substrate element is lowered into the solution and then removed). Further, U.S. Pat. No. 7,375,369 to Sen et al., incorporated herein by reference in its entirety, and U.S. Pat. No. 7,666,382 to Ghenciu et al., incorporated herein by reference in its entirety, teach nanotube solutions well suited for forming a nanotube fabric layer over a substrate element via a spin coating process.

Typically, solutions made from raw nanotubes cannot be used in a semiconductor fabrication plant, because raw nanotubes may contain undesirable impurities, such as amorphous carbon, metal, etc., which would negatively impact the electrical properties of the nanotube film or fabric fabricated therefrom. Accordingly, raw nanotubes—and application solutions thereof—have to be purified and/or processed before use.

SUMMARY OF THE INVENTION

The present disclosure relates to nanotube application solution and methods for removing defects from such application solutions such as to provide highly uniform nanotube fabrics and films with low levels of impurities and defects.

In particular, the present disclosure provides a method for forming a low defect, uniform nanotube fabric. This method comprises first contacting a plurality of nanotubes with a liquid medium to obtain a mixture. The method further comprises purifying the mixture to obtain a purified nanotube solution. The method further comprises degassing the purified nanotube solution, then performing a continuous flow centrifugation process on the purified nanotube solution, and then filtering said purified nanotube solution through a depth filter. Finally the method includes depositing the purified nanotube solution over a material layer to form a nanotube fabric layer.

In particular, the present disclosure provides a method for forming a low defect, uniform nanotube fabric. This method comprises contacting a plurality of nanotubes with a liquid medium to obtain a mixture. The method further comprises purifying the mixture to obtain a purified nanotube solution. The method further comprises degassing the purified nanotube solution. The method further comprises performing at least one additional defect reduction processing step on the purified nanotube solution. Finally the method includes depositing the purified nanotube solution over a material layer to form a nanotube fabric layer.

According to one aspect of the present disclosure defect reduction processing steps include a degassing process, a continuous flow centrifugation process, a batch certification process, and a depth filter.

According to another aspect of the present disclosure only one defect reduction processing step is performed.

According to another aspect of the present disclosure multiple defect reduction processing steps are performed.

According to another aspect of the present disclosure one or more defect reduction step is repeated at least once.

According to another aspect of the present disclosure the nanotube fabric layer is uniform and substantially free of defects.

According to another aspect of the present disclosure the nanotube fabric layer is substantially free of defects having a diameter of greater than about 2 microns.

According to another aspect of the present disclosure the nanotube fabric layer is substantially free of defects having a diameter of greater than about 10 microns.

According to another aspect of the present disclosure the nanotube fabric layer is substantially free of defects having a diameter of greater than about 20 microns.

According to another aspect of the present disclosure the nanotubes are carbon nanotubes.

According to another aspect of the present disclosure the liquid medium is water.

Other features and advantages of the present invention will become apparent from the following description of the invention, which is provided below in relation to the accompanying drawings.

DETAILED DESCRIPTION

Figure 1:
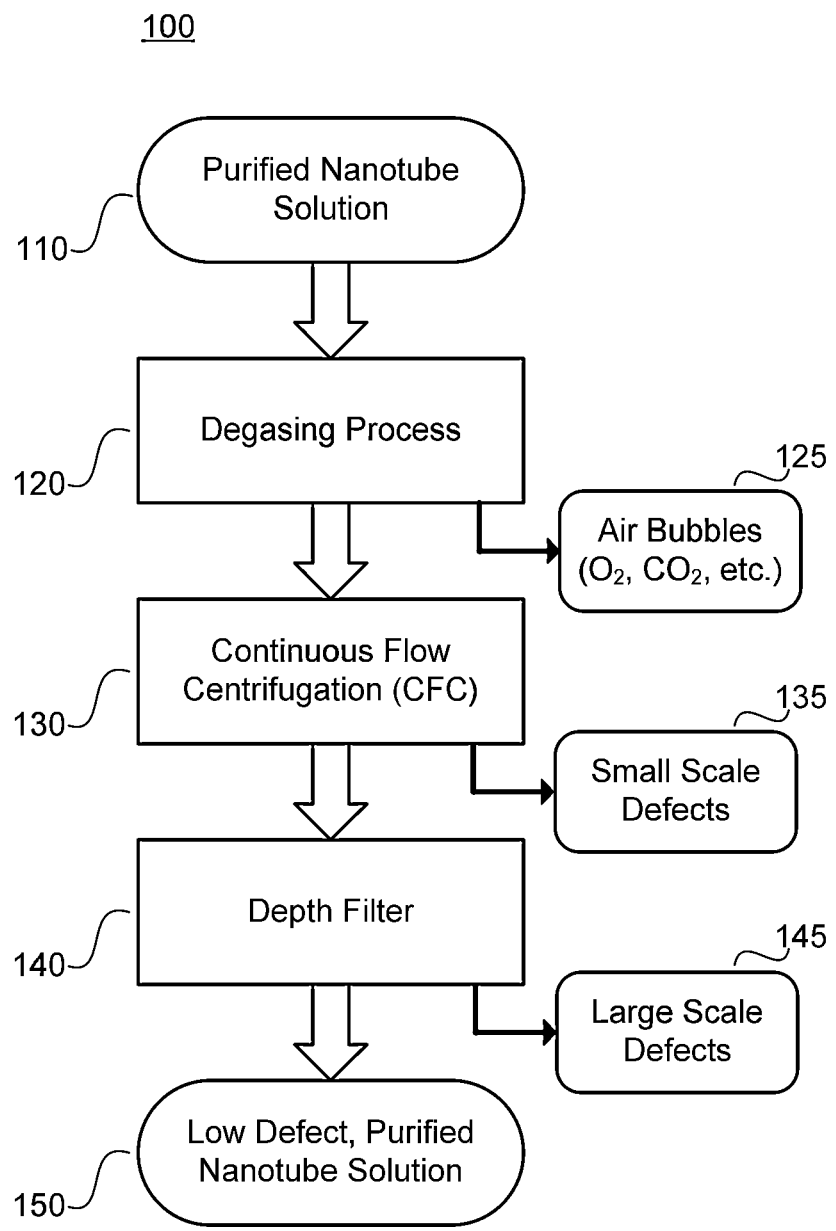
FIG. 1 illustrates a method for producing or purifying a nanotube application solution in accordance with the methods of the present disclosure.

The present disclosure teaches methods for forming low defect nanotube application solutions that can be, in turn, used to provide nanotube fabrics with very low levels of both impurities and defects. As will be described in detail below, one or more defect reduction processes can be used to remove air bubbles, small scale defects, and large scale defects from a nanotube application solution and prevent defects from being transferred in a nanotube fabric formed from such a solution. According to the methods of the present disclosure, defect reduction processes include: a degassing process, a continuous flow centrifugation (CFC) process, a bulk centrifugation process, and processing through a depth filter. In one aspect of the present disclosure a degassing process is used to remove dissolved gases (such as $O_2$ or $CO_2$) from a suspension of nanotubes. In certain applications, the presence of air bubbles within a suspension of nanotubes can facilitate nanotube elements "clumping" together (that is, individual nanotubes entangling with each other) in solution. Within such applications, degassing the nanotube application solution can significantly reduce the formation of these nanotube clumps. Depending on the application, such nanotube clumps within a nanotube fabric can represent defects. In another aspect of the present disclosure, a centrifugation process is used to remove small scale defects from the nanotube application solution. In another aspect of the present disclosure, a depth filter is used to remove large scale defects (such as, but not limited to, nanotube clumps). As will be discussed in detail within the present disclosure, these aspects can be used separately, in concert, or combined in series to realize low defect nanotube application solutions and fabrics.

Carbon nanotube (CNT) raw materials normally come in come in a solid non-solubilized form. They do not readily form stable, non-precipitating suspensions in typical solvating media, such as water, alcohols, esters, and ethers. In order to integrate the manufacturing of nanotube devices with existing semiconductor facilities, it is often necessary to prepare a spin- or spray-coatable nanotube solution or dispersion before use. For example, a nanotube powder has to be suspended, dispersed, solvated, or mixed in a liquid medium or solvent, so as to form a nanotube solution or dispersion. In some cases, this liquid medium could be water (including, but not limited to, distilled water or deionized water). In other cases, this liquid medium could be a non-aqueous solvent, such as, but not limited to, ethyl lactate, dimethyl sulfoxide (DMSO), monomethyl ether, 4-methyl-2 pentanone, N-methylpyrrolidone (NMP), t-butyl alcohol, methoxy propanol, propylene glycol, ethylene glycol, gamma-butyrolactone, benzyl benzoate, salicylaldehyde, tetramethyl ammonium hydroxide, and esters of alpha-hydroxy carboxylic acids. In other embodiments, the liquid medium may contain or be predominantly a non-halogenated solvent.

In this disclosure, the terms "nanotube solution," "nanotube application solution," "nanotube suspension," and "nanotube dispersion" may be used interchangeably to refer to the same thing. The nanotube solution may be an aqueous or non-aqueous solution, and the solvent may be water or an organic/inorganic liquid. In one embodiment, the nanotube solution is an aqueous solution and the solvent is water.

To fabricate memory and/or logic devices in an industrial scale, highly pure nanotube solutions are required—that is, nanotube application solutions that are substantially free from surfactants, trace metals, and/or other additives or impurities. In some cases, substantially free may refer to a concentration of less than or equal to 1 part-per-billion (ppb). Accordingly, extensive purification processes may be performed to the nanotube solution. In some embodiments, the purification processes may include one or more of a cross-flow filtration (CFF) process, a vacuum filtration process, sonication, centrifugation, treatments of certain chemicals, and/or any combinations thereof Exemplary methods for purifying nanotube solutions have been disclosed in U.S. application Ser. No. 13/825,070, entitled "Carbon Nanotube Solutions with Low Contamination and Methods for Purifying Carbon Nanotube Solutions," filed Mar. 19, 2013, the entire contents of which are incorporated herein by reference.

Such purification processes (CFF, sonication, acid treatment, etc.) can be effective in producing highly pure nanotube application solutions—that is, substantially free of surfactants, metallic impurities, etc. However, in certain applications some of these purified nanotube solutions can still contain large scale and small defects (for example, clumps of nanotube elements or broken pieces of nanotubes). In these applications, such defects within the solution can result in non-uniform fabrics, which can be undesirable in, for example, electronic devices employing these fabrics. As such, the present disclosure provides methods for limiting or otherwise preventing the formation of defects within a nanotube application solution during a purification process. The present disclosure also provides methods for removing defects (both large scale defects and small scale defects) from a nanotube application solution. Depending on the application, the methods of the present disclosure can be used after a purification process or directly in line with a purification process. Further, still dependent on the application, the methods of the present disclosure can be used once or used iteratively to achieve a predetermined acceptable defect level.

According to the present disclosure, in certain applications a small scale defect is an element within a nanotube application solution (or within a nanotube fabric) on the order of 100 nm to on the order of 300 nm. In other applications, a small scale defect is an element within a nanotube application solution (or within a nanotube fabric) on the order of 50 nm or smaller. In other applications a small scale defect is an element within a nanotube application solution (or within a nanotube fabric) on the order of 300 nm or larger. In still other applications a small scale defect is a detectable element within a nanotube application solution (or within a nanotube fabric) that is sufficiently small as compared to the individual nanotube elements suspended within the solution (or fabric).

Further, according to the present disclosure, in certain applications a large scale defect is an element within a nanotube application solution (or within a nanotube fabric) on the order of 1 micron, 2 microns, 10 microns, or 20 microns. In other applications a large scale defect is an element within a nanotube application solution (or within a nanotube fabric) that is sufficiently large as compared to the individual nanotube elements suspended within the solution (or within the fabric).

Further, according to the present disclosure, within certain applications substantially free of defects can refer to a nanotube fabric (or nanotube solution) free of defects greater than 1 micron, 2 microns, 10 microns, or 20 microns. In other applications, substantially free of defects can also refer to nanotube fabrics (or nanotube solutions) free of defects that are significantly large as compared to the individual nanotube elements within the fabric (or suspended within the solution). In other applications, substantially free of defects can also refer to nanotube fabrics (or nanotube solutions) free of elements on the order of 50 nm, 100 nm, 200 nm, or 300 nm. In other applications, substantially free of defects can also refer to nanotube fabrics (or nanotube solutions) free of detectable elements that are sufficiently small as compared with the nanotube elements within the nanotube fabric (or suspended within the solution).

Further, according to the present disclosure in certain applications a uniform nanotube fabric is a fabric substantially free of defects, wherein nanotube elements are spaced in a substantially even arrangement and are relatively of similar size.

A fabric of nanotubes as referred to herein for the present disclosure includes a layer of multiple, interconnected carbon nanotubes. A fabric of nanotubes (or nanofabric), in the present disclosure, e.g., a non-woven carbon nanotube (CNT) fabric, may, for example, have a structure of multiple entangled nanotubes that are irregularly arranged relative to one another. Alternatively, or in addition, for example, the fabric of nanotubes for the present disclosure may possess some degree of positional regularity of the nanotubes, e.g., some degree of parallelism along their long axes. Such positional regularity may be found, for example, on a relatively small scale wherein flat arrays of nanotubes are arranged together along their long axes in rafts on the order of one nanotube long and ten to twenty nanotubes wide. In other examples, such positional regularity may be found on a larger scale, with regions of ordered nanotubes, in some cases, extended over substantially the entire fabric layer.

The fabrics of nanotubes retain desirable physical properties of the nanotubes from which they are formed. For example, in some electrical applications, the fabric preferably has a sufficient amount of nanotubes in contact so that at least one ohmic (metallic) or semi-conductive pathway exists from a given point within the fabric to another point within the fabric. Single walled nanotubes may typically have a diameter of about 1-3 nm, and multi walled nanotubes may typically have a diameter of about 3-30 nm. Nanotubes may have lengths ranging from about 0.2 microns to about 200 microns, for example. The nanotubes may curve and occasionally cross one another. Gaps in the fabric, i.e., between nanotubes either laterally or vertically, may exist. Such fabrics may include single-walled nanotubes, multi-walled nanotubes, or both.

The fabric may have small areas of discontinuity with no nanotubes present. The fabric may be prepared as a layer or as multiple fabric layers, one formed over another. The thickness of the fabric can be chosen as thin as substantially a monolayer of nanotubes or can be chosen much thicker, e.g., tens of nanometers to hundreds of microns in thickness. The porosity of the fabrics can vary from low density fabrics with high porosity to high density fabrics with low porosity. Such fabrics can be prepared by growing nanotubes using chemical vapor deposition (CVD) processes in conjunction with various catalysts, for example.

Other methods for generating such fabrics may involve using spin-coating techniques and spray-coating techniques with preformed nanotubes suspended in a suitable solvent, silk screen printing, gravure printing, and electrostatic spray coating. Nanoparticles of other materials can be mixed with suspensions of nanotubes in such solvents and deposited by spin coating and spray coating to form fabrics with nanoparticles dispersed among the nanotubes.

For example, use of a spin coating process, commonly employed in the preparation of thin film materials for electronic applications, including nanotubes involves applying an excess of the solution containing the material to be deposited, generally in a solvent or liquid suspension vehicle to a spinning substrate, often a silicon wafer on a rotating platen. Rotation, typically at high speeds spreads the fluid by centrifugal acceleration. Spinning is continued while the liquid is spun off of the edge of the substrate leaving behind a thin uniform film of nanotubes, in our case. The vehicle or solvent is typically volatile and evaporates from the film, during the process or in combination with a post deposition evaporative procedure.

As described within U.S. Pat. No. 7,375,369 to Sen et al. and U.S. Pat. No. 7,666,382 to Ghenciu et al., both incorporated herein by reference in their entirety, nanotube fabrics and films can be formed by applying a nanotube application solution (for example, but not limited to, a plurality of nanotube elements suspended within an aqueous solution) over a substrate element. A spin coating process, for example, can be used to evenly distribute the nanotube elements over the substrate element, creating a substantially uniform layer of nanotube elements. In other cases, other processes (such as, but not limited to, spray coating processes, dip coating processes, silk screen printing processes, and gravure printing processes) can be used to apply and distribute the nanotube elements over the substrate element. In other cases, CVD growth of nanotubes on a material surface may be used to realize an unordered nanotube fabric layer.

Further, U.S. Patent Application Publication No. US 2013 0052449 to Sen et al., incorporated herein by reference in its entirety, teaches methods of adjusting certain parameters (for example, the nanotube density or the concentrations of certain ionic species) within nanotube application solutions to either promote or discourage rafting—that is, the tendency for nanotube elements to group together along their sidewalls and form dense, raft-like structures—within a nanotube fabric layer formed with such a solution. By increasing the incidence of rafting within nanotube fabric layers, the density of such fabric layers can be increased, reducing both the number and size of voids and gaps within such fabric layers.

It should be noted that nanotube elements used and referenced within the embodiments of the present disclosure may be single-walled nanotubes, multi-walled nanotubes, or mixtures thereof and may be of varying lengths. Further, the nanotubes may be conductive, semiconductive, or combinations thereof. Further, the nanotubes may be functionalized (for example, by oxidation with nitric acid resulting in alcohol, aldehydic, ketonic, or carboxylic moieties attached to the nanotubes), or they may be non-functionalized.

Nanotube elements may be functionalized for a plurality of reasons. For example, certain moieties may be formed on the sidewalls of nanotube elements to add in the dispersion of those elements within an application solution. In another example, certain moieties formed on the sidewalls of nanotube elements can aid in the efficient formation of a nanotube fabric. In a further example, nanotube elements can be functionalized with certain moieties such as to electrically insulate the sidewalls of the nanotube elements. Nanotube elements can be functionalized by attaching organic, silica, or metallic moieties (or some combination thereof) to the sidewalls of the nanotube elements. Such moieties can interact with nanotube elements covalently or remain affixed through $\pi$-$\pi$ bonding.

FIG. 1 is a flow chart illustrating an exemplary defect removal process 100 for a nanotube application solution according to the methods of the present disclosure. In a first process step 110 a volume of nanotubes is suspended in a solvent (such as, but not limited to, water or ethyl lactate) and purified to realize a purified nanotube solution. The nanotubes are combined with the solvent such that the solution remains stable—that is, the nanotubes are suspended, dispersed, solvated, or mixed in the liquid medium without substantial precipitation, flocculation or any other macroscopic interaction that would interfere with the ability to apply the applicator solution to a substrate and form a uniform porosity. Typical nanotube concentrations range from about 1 mg/L to 100 g/L, or from about 1 mg/L to 1 g/L, or about 10 mg/L, or about 100 mg/L, or even about 1000 mg/L with a common concentration used for memory and logic applications of 100 mg/L. Such a concentration is exemplary; various useful concentrations ranges depend upon the specific application.

Methods for suspending nanotubes within a solvent and purifying the resulting solution are discussed in greater detail in the incorporated references. As previously discussed, these purification methods can be used prior to or in concert with the defect removal/prevention methods of the present disclosure. Within one aspect of the present disclosure, a purified nanotube solution is a solution suitable for use within a class 1 semiconductor facility. Within another aspect of the present disclosure a purified nanotube solution is a solution substantially free of surfactants and metal impurities.

Within other aspects of the present disclosure a purified nanotube solution is a solution that comprises less than 500 parts per billion, 200 parts per billion, or 50 parts per billion metallic impurities. Within other aspects of the present disclosure a purified nanotube solution is a solution that comprises less than 500 parts per billion, 200 parts per billion, or 50 parts per billion heavy metal impurities. Within another aspect of the present disclosure a purified nanotube solution is a solution that comprises from 0.1 to 10 parts per billion of heavy metal impurities.

Within another aspect of the present disclosure a purified nanotube solution is a solution that comprises less than 500 parts per billion of alkali (group I element) and alkaline earth (group II element) impurities. Within another aspect of the present disclosure a purified nanotube solution is a solution that comprises from 1 to 25 parts per billion of alkali (group I element) and alkaline earth (group II element) impurities. Within another aspect of the present disclosure a purified nanotube solution is a solution that comprises less than 500 parts per billion of transition metal impurities. Within another aspect of the present disclosure a purified nanotube solution is a solution that comprises from 0.1 to 10 parts per billion of transition metal impurities.

Within another aspect of the present disclosure a purified nanotube solution is a solution that is substantially free of particle impurities having a diameter of greater than about 300 nm. Within another aspect of the present disclosure a purified nanotube solution is a solution that is substantially free of particle impurities having a diameter of greater than about 45 nm.

Referring again to FIG. 1, in a next process step 120, the purified nanotube solution is put through a degassing process. In this way, dissolved gasses 125 (such as, but not limited to, $O_2$, $N_2$, and $CO_2$) are removed from the purified nanotube solution, limiting or otherwise substantially eliminating air bubbles within the solution. Within certain applications, air bubbles dissolved within a nanotube application can promote clumping and tangling of nanotubes within the solution, causing defects. Within such applications, dissolved air bubbles can be especially problematic during solution purification processing steps that agitate the solution (such as, but not limited to filtering and centrifugation processes) and also adversely impact the shelf life (that is, ability for the nanotube application solution to remain stable over a period of time) of the solution. Further, in other applications, air bubbles within a nanotube application solution can result in small scale non-uniformities with the nanotube fabric. As such, within these applications it can be advantageous to remove, via a degassing process, some or substantially all of the dissolved gasses within the nanotube application solution. Further, in certain applications it may be advantageous to perform a degassing process prior to one or more purification process steps. In this way, defect formation can be limited during the purification process.

The nanotube application solution can be degassed through a plurality of techniques, depending on the needs of a specific application. For example, heating and agitating the solution (e.g., heating the solution a few degrees above room temperature and sonicating). In another example, the solution can be placed under partial pressure and sonicated (vacuum degasification). In another example, the solution can be passed through a gas-liquid separation membrane (membrane degasification). In another example, the solution can be bubbled with an inert gas (such as, but not limited to argon or helium) and agitated to displace the dissolved gasses initially present in the system. In another example, the solution can be passed through a continuous flow centrifugation (CFC) process. Other methods of degasification can be employed as best fits the needs of a specific application and are well known to those skilled in the art. Further, the degasification process can be performed once or multiple times, dependent on the needs of the specific application. For example, a degassing process could be inserted between each step of a combined purification and defect removal process to improve the effectiveness of each individual process step.

In a next process step 130, the nanotube application solution is processed through a continuous flow centrifugation (CFC) process. In this way, small scale defects can be separated from the nanotube application solution. In certain applications a CFC process can be advantageous as compared to batch centrifugation. This is especially the case in applications where high volumes of nanotube application solution are required (such as, but not limited to, a large scale semiconductor fabrication operation). In such applications, a CFC process can be employed to remove small scale defects from a nanotube application solution in a continuous flow, providing high volumes of nanotube application solution relatively rapidly.

In certain applications the use of a CFC process (as compared with a batch centrifugation process) may lead to higher quality products, reduced manufacturing time, and can be less labor intensive. Within the present disclosure, continuous flow centrifugation (CFC) refers to a method to separate or sediment particulate solids from a solution or suspension using centrifugal force applied with a CFC process. The CFC process may allow for particulate separation or removal from a solution in a continuous mode of operation of the centrifuge. Any commercially available "high-g" centrifuges or ultracentrifuges may be utilized. The CFC may have the ability to separate particles from solution by continuously feeding the solution to the centrifuge rotor, followed by particles separation or sedimentation, and continuous removal of the particulate free product from the centrifuge rotor. For example, lab scale continuous flow ultracentrifuges (that are capable of generating up to 10 L of particulate free product in one hour) or manufacturing scale continuous flow centrifuges (that are capable of generating up to 100 L particulate free product in one hour) may be utilized. A non-limiting example of a lab scale continuous flow ultracentrifuge may be the Sorvall Discovery 90/100 with TCF32 rotor, Alfa Wassermann Promatix-1000. A non-limiting example of a manufacturing scale continuous flow ultracentrifuge may be the Sorvall CC40 or CC40S, or Alfa Wassermann PKII or KII. Further, in another non-limiting example, a continuous flow centrifuge can use g forces between 30000-120000 (using a continuous flow rotor on the order of 20,000 to 40,000 rpm) and adequate flow rates. Within the methods of the present disclosure, a nanotube application solution can be processed through a CFC process once or multiple times, or in series, dependent on the needs of a specific application.

It should be noted that while FIG. 1 lists a CFC process, a batch centrifugation process could also be used as a defect reduction processing step, dependent on the needs of a specific application. For example, within an application wherein continuous flow of a solution through a system was not required or was not particularly advantageous, a bulk centrication process could be used in place of process step 130.

In a next process step 140, the nanotube application solution is filtered through a depth filter to remove large scale defects 145 (such as, but not limited to, clumps of nanotubes or damaged nanotubes) from the solution. Depth filters comprise one or more layers of material which provide a relatively long, torturous path through which the solution is strained. For example, a depth filter may comprise a bundle of Teflon fibers. The long, narrow gaps between the individual Teflon fibers form a plurality of pores which allow high aspect ratio elements (such as carbon nanotubes) to pass freely, but trap defects such as clumps of nanotubes, damaged nanotubes, or other large scale impurities. In certain applications, a multi-layer depth filter can be used with varying pore sizes and geometries in order to remove different size levels of defects. In this way, a depth filter can be employed to separate large scale defects from a nanotube application solution.

The use of a depth filter can be especially well suited to applications where high volumes of nanotube application solution are required (such as, but not limited to, a large scale semiconductor fabrication operation). Certain purification techniques—such as, but not limited to, batch centrifugation processes—require large "hold-up" volumes of solution to be effective. That is, such processes require a significantly large initial supply of solution to be effective. For example, a batch centrifugation process purifies a preselected volume of solution all at once. However, a depth filter can process a nanotube application solution continuously, allowing essentially any volume of solution to be processed relatively quickly. In this way, within certain applications, a depth filter can provide defect removal techniques at lower cost and higher throughput. Further, within the methods of the present disclosure, a nanotube application solution can be processed once or multiple times, dependent on the needs of a specific application.

Referring now to the final process step 150, the original purified nanotube solution has been treated through a degassing process (process step 120), a CFC process (process step 130), and filtered through a depth filter (process step 140) to realize a low defect purified nanotube solution. That is, the original purified nanotube solution has been treated such as to both large scale and small scale defects to such levels as to be sufficient to form highly uniform, homogeneous nanotube fabrics.

It should be noted that while the exemplary nanotube application solution defect removal process illustrated in FIG. 1 depicts a nanotube solution being processed sequentially through three separate defect removal steps in series, the methods of the present disclosure are not limited in this regard. Indeed, a defect removal process according to the present disclosure could comprise using only one or two of the methods described with respect to FIG. 1 (that is, degassing, CFC, or the use of a depth filter). Further, a defect removal process according to the present disclosure could include at least one of the methods described with respect to FIG. 1 before, after, or in concert with at least one purification process step (such as, but not limited to, a cross-flow filtration process, an ion exchange process, acid treatment, or a centrifugation process). Further, a defect removal process according to the methods of the present disclosure could include repeating any of the methods described with respect to FIG. 1 multiple times.

While, as stated above, the present disclosure is not limited to the exemplary process detailed in FIG. 1, it should be noted that the three defect removal processes described can be used—within certain applications—in a complementary manner to realize low defect solutions and fabrics. As previously discussed, a degassing process 120 is helpful in removing air bubbles within a solution, which can sometimes serve as nucleation sites for nanotube clumps (large scale defects) during other processing steps. A centrifugation process 130 is well suited for removing small scale defects, but in some applications can introduce large scale defects as the solution is agitated. Within the exemplary process layout of FIG. 1, the formation of such large scale defects during the CFC process 130 is mitigated by the degassing process performed immediately before the CFC process 130. And finally, a depth filter 140 is well suited for removing large scale defects, but not as effective in removing small scale defects. In this way, the degassing process 120 limits the formation of defects, the CFC process 130 then removes small scale defects (which might be missed using a depth filter alone), and the depth filter 140 removes the large scale defects (both those originally present in the solution and those formed during the CFC process 130). While FIG. 1 depicts linear three step process for ease of explanation, it should be noted that the use of these three processes can be used in any order, iteration, or combination as is required by a specific application.

It should also be noted that the methods of the present disclosure can be used to form a defect removal system which can be arranged for a point of use nanotube fabric deposition system. For example, a system employing one or more of the defect removal processes described within the present disclosure can be placed in line with a nanotube application solution spin coating process. Continuing with this non-limiting example, nanotube application solution could be degassed, processed through a CFC process, then degassed a second time as it is fed into the spin coating supply line. In this way, defects can be removed from a nanotube application solution in situ as it is deposited onto a substrate to form a nanotube fabric. One or more defect reduction processes of the present disclosure can be employed (alone or combined with other methods) to provide this in situ, point of use defect removal.

Figure 2A:
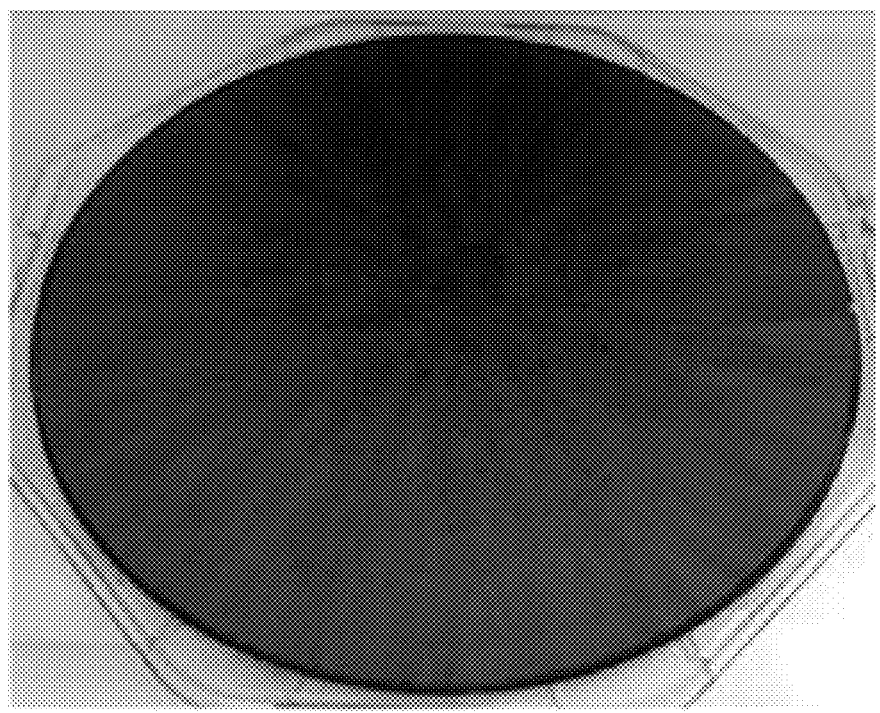
FIG. 2A depicts a nanotube fabric formed with an unpurified nanotube application solution.

FIG. 2A is an image depicting a nanotube fabric 201 formed from a spin coating operation of a purified nanotube solution that had not been subjected to any of the defect removal steps described with respect to FIG. 1. As shown in the image, a plurality of defects (both large and small scale) and the non-uniformity of the fabric are visually evident in the nanotube fabric layer.

Figure 2B:
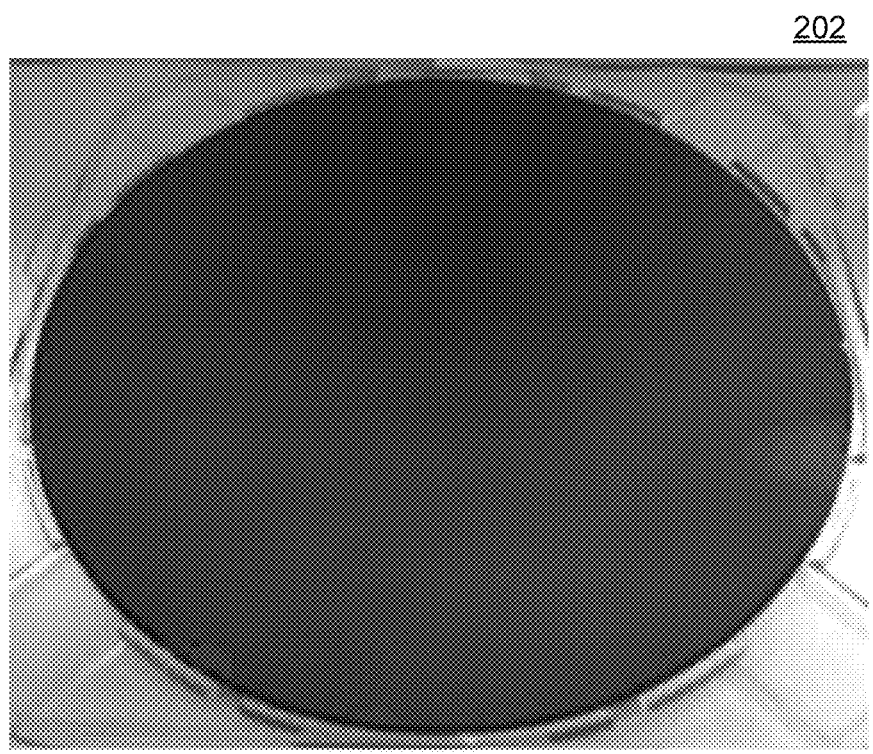
FIG. 2B depicts a nanotube fabric formed from a nanotube application solution purified through the methods of the present disclosure.

Conversely, FIG. 2B is an image depicting a nanotube fabric 202 formed from a spin coating operation of a nanotube solution that had been treated with the purification process described with respect to FIG. 1. As is shown, the nanotube fabric of FIG. 2B is substantially free of defects and is substantially uniform as compared with the fabric of FIG. 2A.

Figure 3:
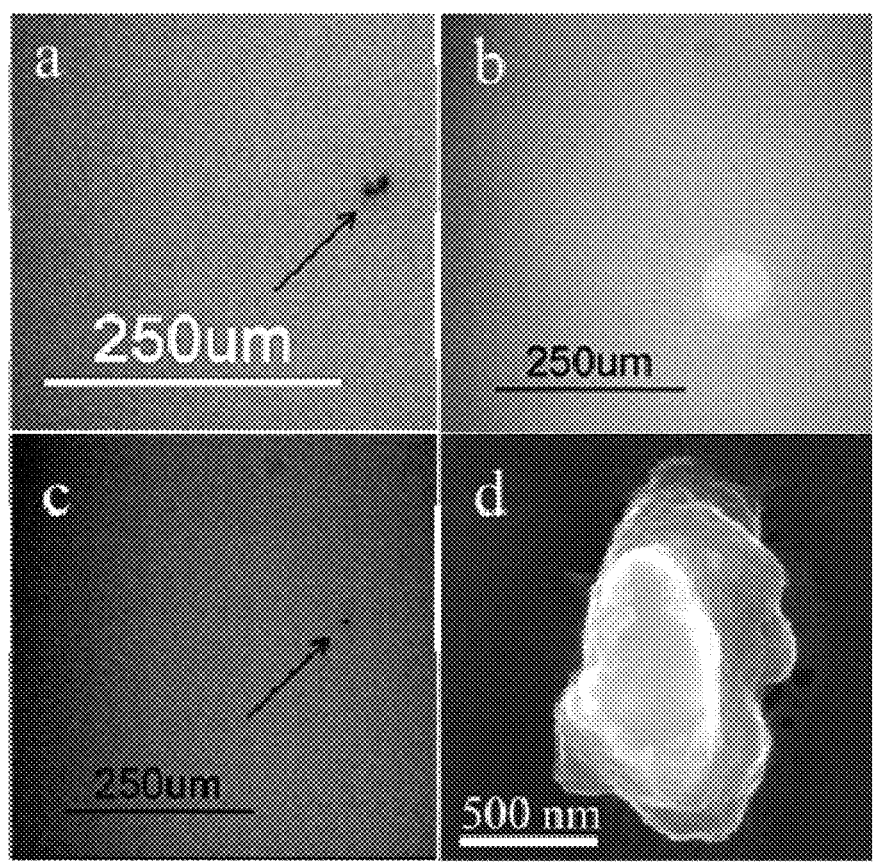
FIG. 3 is a series of images depicting four typical defects within a nanotube fabric layer which can be prevented using the methods of the present disclosure.

FIG. 3 is an image depicting four types of defects typically found in a nanotube fabric layer. The defect reduction processes of the present disclosure are well suited to preventing such defects by removing air bubbles, nanotube clumps, and broken pieces of nanotubes from a nanotube application solution prior to or during the formation of a nanotube fabric.

Referring to image (a) within FIG. 3, a nanotube cluster defect—that is, an entanglement or clumping together of several individual nanotube elements—is shown. As previously discussed with respect to the methods of the present disclosure, a depth filtration process is well suited to removing or otherwise preventing the formation of this type of large scale defect.

Referring now to image (b) within FIG. 3, a circle type defect—that is, a circular area in which a layer (or multiple layers) of nanotube fabric is missing—is shown. Within certain applications, such a defect can be caused by an air bubble trapped in the film during drying step. As previously discussed, a degassing process is well suited to removing air bubbles from a nanotube application solution prior to (or during) the formation of a nanotube fabric and thus, in turn, preventing the formation of this type of defect.

Referring now to image (c) within FIG. 3, a large scale defect—a particle approximately 4 microns in size—is shown. And referring to image (d) within FIG. 3, a small scale defect—a particle on the order of 500 nm in size—is shown. As described in detail above with respect to the methods of the present disclosure, such defects can be removed from a nanotube application solution with a combination of depth filtering and centrifugation prior to (or during) the formation of a nanotube fabric.

Although the present invention has been described in relation to particular embodiments thereof, many other variations and modifications and other uses will become apparent to those skilled in the art. It is preferred, therefore, that the present invention not be limited by the specific disclosure herein, but rather be defined by the appended claims; and that these claims will encompass modifications of and improvements to what has been described.

The invention claimed is:

1. A method for forming a low defect, uniform nanotube fabric comprising:
   contacting a plurality of nanotubes with a liquid medium to obtain a mixture;
   purifying said mixture to obtain a purified nanotube solution;
   degassing said purified nanotube solution;
   performing at least one additional defect reduction processing step on said purified nanotube solution; and
   depositing said purified nanotube solution over a material layer to form a nanotube fabric layer wherein said step of degassing is performed immediately prior to said at least one additional defect reduction processing step; and wherein said purified nanotube solution remains in a degassed state during said at least one additional defect reduction step.

2. The method of claim 1 wherein said at least one additional defect reduction processing step includes at least one of a degassing process, a continuous flow centrifugation process, a batch centrifugation process, and a depth filter.

3. The method of claim 1 wherein at least one of said at least one defect reduction processing step is repeated at least once.

4. The method of claim 1 wherein said step of degassing prevents the formation of nanotube clumps during the steps of performing, and depositing.

5. The method of claim 1 wherein said one additional defect reduction processing step removes small scale defects from said purified nanotube solution.

6. The method of claim 5 wherein small scale defects are elements within said purified nanotube solution on the order of 100 nanometers to on the order of 300 nanometers.

7. The method of claim 1 wherein said one additional defect reduction step removes large scale defects from said purified nanotube solution.

8. The method of claim 7 wherein large scale defects are elements within said nanotube application solution greater than 2 microns.

9. The method of claim 7 wherein large scale defects are elements within said nanotube application solution greater than 10 microns.

10. The method of claim 7 wherein large scale defects are elements within said nanotube application solution greater than 20 microns.

11. The method of claim 1 wherein said nanotube fabric layer is uniform and substantially free of defects.

12. The method of claim 1 wherein said nanotube fabric layer is substantially free of defects having a diameter of greater than about 2 microns.

13. The method of claim 1 wherein said nanotube fabric layer is substantially free of defects having a diameter of greater than about 10 microns.

14. The method of claim 1 wherein said nanotube fabric layer is substantially free of defects having a diameter of greater than about 20 microns.

15. The method of claim 1 wherein said step of purifying comprises at least one of an acid oxidation process, a cross-flow filtration process, an ion exchange process, and a centrifugation process.

16. The method of claim 15 wherein at least one of said acid oxidation process, said cross-flow filtration process, said ion exchange process, and said centrifugation process is repeated at least once.

17. The method of claim 1 wherein said nanotubes comprise conductive nanotubes.

18. The method of claim 1 wherein said nanotubes comprise semiconductive nanotubes.

19. The method of claim 1 wherein said nanotubes comprise single-walled carbon nanotubes.

20. The method of claim 1 wherein said nanotubes comprise multi-walled carbon nanotubes.

21. The method of claim 1 wherein said purified nanotube solution comprises nanotubes at a concentration of greater than 100 mg/L.

22. The method of claim 1 wherein said purified nanotube solution comprises nanotubes at a concentration of greater than 1000 mg/L.

23. The method of claim 1 wherein said liquid medium is water.

* * * * *